United States Patent
Cheng et al.

(10) Patent No.: US 7,786,497 B2
(45) Date of Patent: Aug. 31, 2010

(54) PIXEL STRUCTURE OF LCD AND FABRICATION METHOD THEREOF

(75) Inventors: Yi-Sheng Cheng, Hsin-Chu (TW); Chih-Wei Chao, Hsin-Chu (TW)

(73) Assignee: AU Optronics Corporation, Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/019,717

(22) Filed: Jan. 25, 2008

(65) Prior Publication Data

US 2008/0296574 A1    Dec. 4, 2008

(30) Foreign Application Priority Data

May 30, 2007   (TW) ............................... 96119417 A

(51) Int. Cl.
*H01L 21/00* (2006.01)
(52) U.S. Cl. .................... 257/98; 257/59; 257/E33.068
(58) Field of Classification Search .................. 438/22; 257/59, 980, 98, E33.068

See application file for complete search history.

(56) References Cited

U.S. PATENT DOCUMENTS

| 5,605,847 | A | | 2/1997 | Zhang |
| 5,734,449 | A | * | 3/1998 | Jang .............................. 349/39 |
| 6,812,912 | B2 | * | 11/2004 | Miyajima et al. ............. 345/92 |
| 7,196,746 | B2 | | 3/2007 | Yang |

FOREIGN PATENT DOCUMENTS

TW    200710471    3/2007

OTHER PUBLICATIONS

English language translation of abstract and pertinent part of TW 200710471 (published Mar. 16, 2007).

* cited by examiner

*Primary Examiner*—Zandra Smith
*Assistant Examiner*—Jamie Niesz
(74) *Attorney, Agent, or Firm*—Thomas, Kayden, Horstemeyer & Risley, LLP

(57) ABSTRACT

In this pixel structure, a metal layer/a dielectric layer/a heavily doped silicon layer constitutes a bottom electrode/a capacitor dielectric layer/a top electrode of a storage capacitor. At the same time, a metal shielding layer is formed under the thin film transistor to decrease photo-leakage-current.

19 Claims, 12 Drawing Sheets

PIXEL STRUCTURE OF LCD AND FABRICATION METHOD THEREOF

RELATED APPLICATIONS

This application claims priority to Taiwan Application Serial Number 96119417, filed May 30, 2007, which is herein incorporated by reference.

BACKGROUND

1. Field of Invention

The present invention relates to a liquid crystal display and a fabrication method thereof. More particularly, the present invention relates to a pixel structure of the liquid crystal display and a fabrication method thereof.

2. Description of Related Art

In pixel structure of a conventional liquid crystal display (LCD), the bottom electrode of the storage capacitor and the silicon island of the thin film transistor (TFT) are usually made by the same silicon layer. The top electrode of the storage capacitor and the gate electrode of the TFT are usually made by the same metal layer. Since the bottom electrode is covered by the top electrode, implanting dopants into the bottom electrode cannot be effectively performed. Therefore, the capacity of the storage capacitor cannot be effectively increased, and leakage current is easily generated when the transistor is exposed to light.

SUMMARY

In one aspect of this invention, a pixel structure of a liquid crystal display and a fabrication method thereof are provided.

A first metal layer, a first dielectric layer, and a first silicon layer are sequentially formed on a substrate. The first metal layer, the first dielectric layer, and the first silicon layer are then patterned to form an active stack and a capacitive stack respectively on an active area and a capacitive area of the substrate and to form a capacitive line connecting the capacitive stack. A gate dielectric layer and a second metal layer are sequentially formed on the substrate, the active stack, the capacitive stack, and the capacitive line stack. The second metal layer is patterned to form a gate on the active stack and a scan line connecting the gate. The silicon layer of the active stack, the capacitive stack and the capacitive line stack are heavily doped by using the gate and the scan line as a mask to form heavily doped regions. The heavily doped regions on both terminals of the silicon layer in the active stack are respectively source and drain, and the first metal layer and the heavily doped regions are respectively a first electrode and a second electrode of a storage capacitor.

A second dielectric layer is formed on the gate dielectric layer, the gate, and the scan line. The second dielectric layer is then patterned to form a first opening, a second opening and a third opening to respectively expose the drain, the source and the second electrode. A third metal layer is formed over the second dielectric layer and in the first, the second and the third openings. Next, the third metal layer is patterned to form a data line, a first conductive line connecting the data line and the source, and a second conductive line connecting the drain and the second electrode. A planar layer is formed on the second dielectric layer, the data line, the first conductive line and the second conductive line and then patterned to form a fourth opening to expose the second conductive line. A transparent conductive layer is formed on the planar layer and in the fourth opening and then patterned to form a pixel electrode connecting the second conductive line.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings.

Single Gate Embodiment

FIGS. 1A-6B are diagrams showing a process for fabricating a pixel array for use in an LCD, according to a single-gate embodiment of this invention.

Figure 1A:
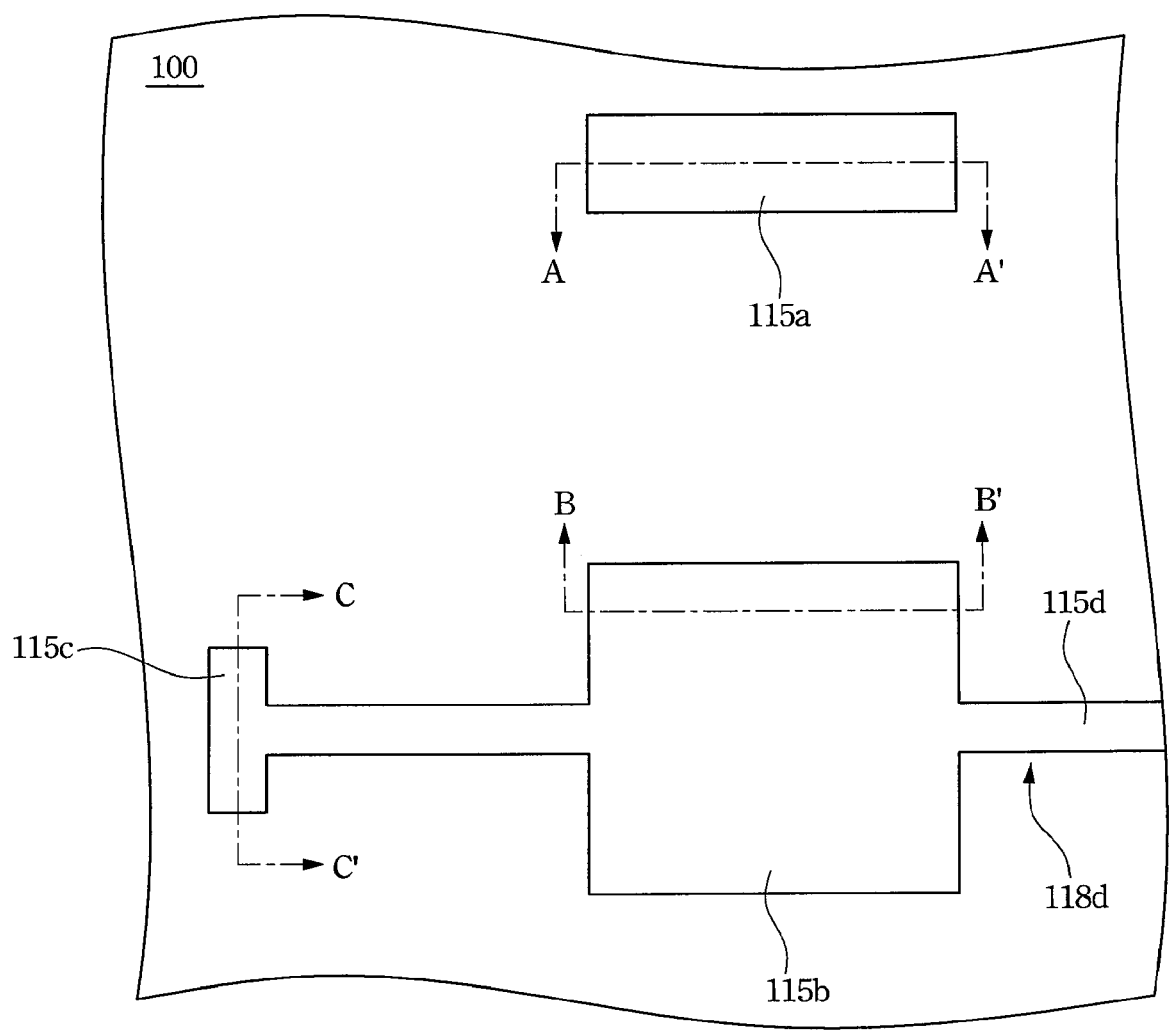
FIGS. 1A-6B are diagrams showing a process for fabricating a pixel array for use in an LCD, according to a single-gate embodiment of this invention.
Figure 1B:
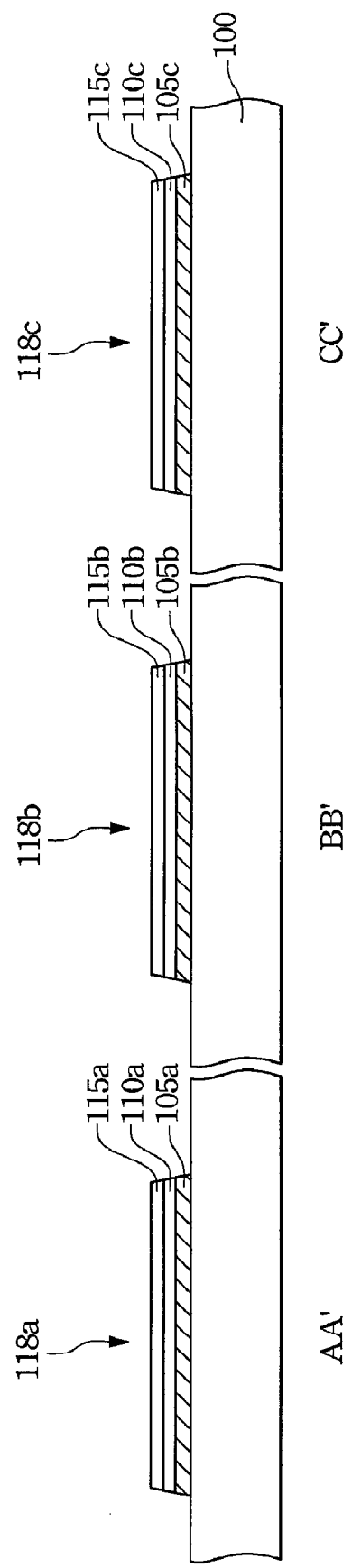

FIG. 1A is a plan view, and FIG. 1B are cross-sectional views of sections AA', BB', and CC'. In FIGS. 1A-1B, a first metal layer, a first dielectric layer, and a silicon layer are sequentially formed on a substrate 100 and then patterned to form an active stack 118a, a capacitive stack 118b and a terminal stack 118c respectively on an active area (section AA'), a capacitive area (section BB'), and a terminal area (section CC'). In addition, a capacitive line stack 118d is also formed to connect the capacitive stack 118b and the terminal stack 118c at the same time. The material of the silicon layer can be polysilicon or amorphous silicon, for example. The material of the first dielectric layer can be silicon oxide, for example.

The active stack 118a is obtained by stacking a metal light-shielding layer 105a, a first dielectric layer 110a and a silicon island 115a. The metal light-shielding layer 105a is made by the first metal layer, and the silicon island 115a is made by the silicon layer. The capacitive stack 118b is obtained by stacking a first electrode 105b, a capacitive dielectric layer 110b and a silicon layer 115b. The first electrode 105b is made by the first metal layer, and the capacitive dielectric layer 110b is made by the first dielectric layer. The terminal stack 118c is obtained by stacking a first terminal 105c, a first dielectric layer 110c and a silicon layer 115c. The first terminal 105c is made by the first metal layer. In FIG. 1A, the capacitive line stack 118d above is obtained by stacking the first metal layer, the first dielectric layer and the silicon layer, and only the silicon layer 115d on the top can be seen in FIG. 1A.

Figure 2A:
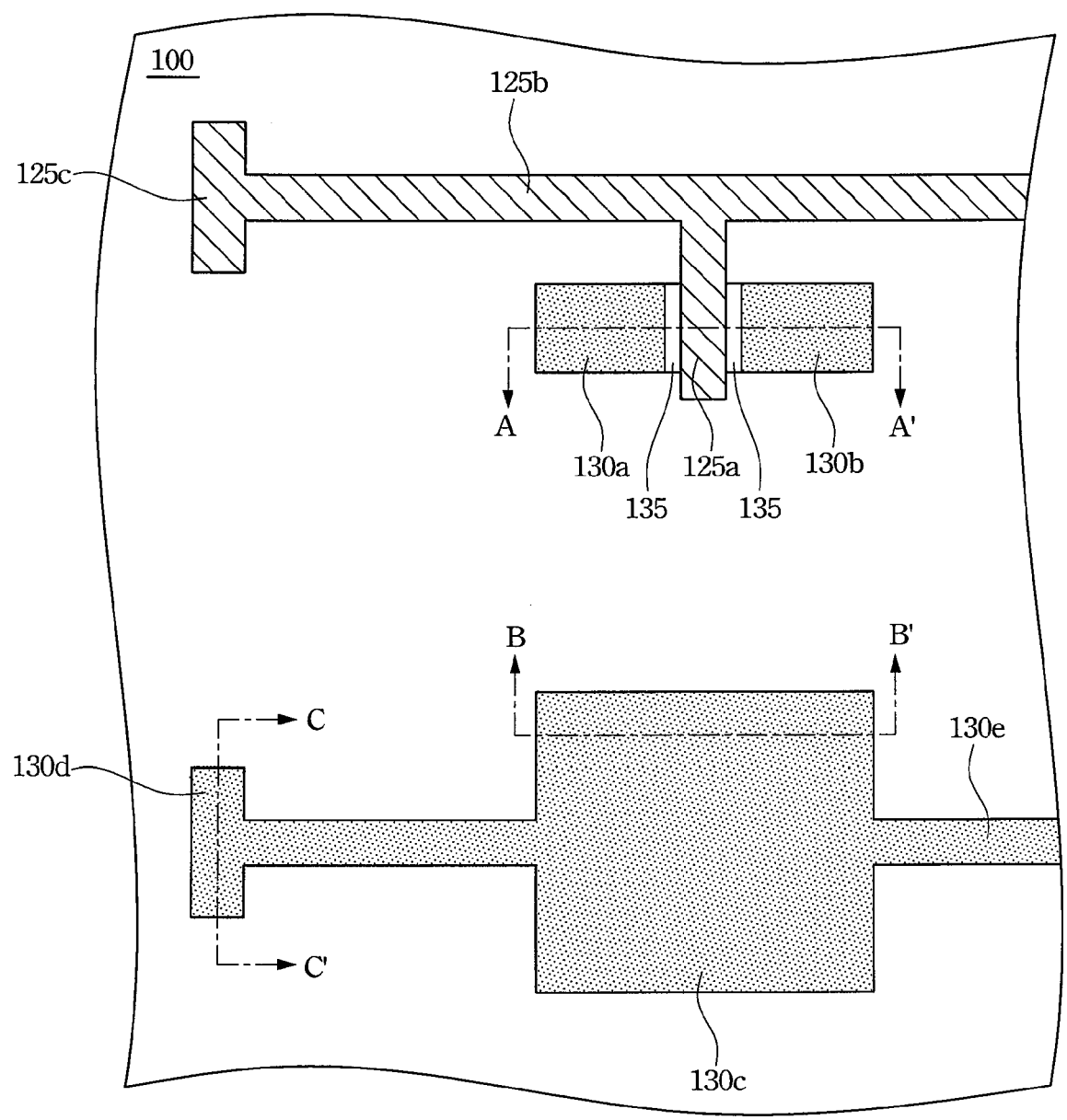
Figure 2B:
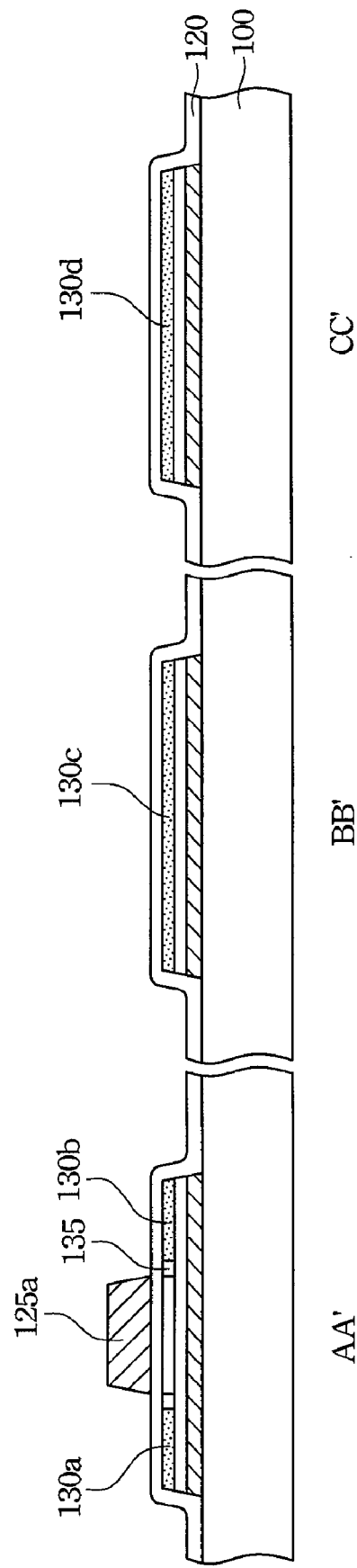

FIG. 2A is a plan view, and FIG. 2B are cross-sectional views of sections AA', BB', and CC'. In FIGS. 2A-2B, a gate dielectric layer 120 and a second metal layer are sequentially formed on the substrate 100, the active stack 118a, the capacitive stack 118b, the terminal stack 118c and the capacitive line stack 118d. The second metal layer is then patterned to form a gate 125a on the active stack 118a, a scan line 125b connecting the gate 125a, and a second terminal 125c connecting the scan line 125b. Next, the silicon island 115a, and the silicon layers 115b, 115c, 115d undergo ion implanting process to form heavily doped regions by using the gate 15a as the implanting mask. The heavily doped regions in the silicon island 115a serve as source 130a and drain 130b. The heavily doped silicon layer 115b serves as a second electrode 130c. The heavily doped silicon layers 115c and 115d are heavily doped regions 130d and 130e, respectively. Accordingly, the first electrode 105b and the second electrode 130c constitute a storage capacitor. The material of the gate dielectric layer 120 above can be silicon oxide, silicon nitride, or silicon oxynitride, for example.

Optionally, the gate 125a with the scan line 125b, can be further isotropically etched. Then, the reduced gate 125a can be served as a mask for lightly doping the silicon island 115a to form lightly doped regions 135 between the source 130a and the drain 130b.

Figure 3:
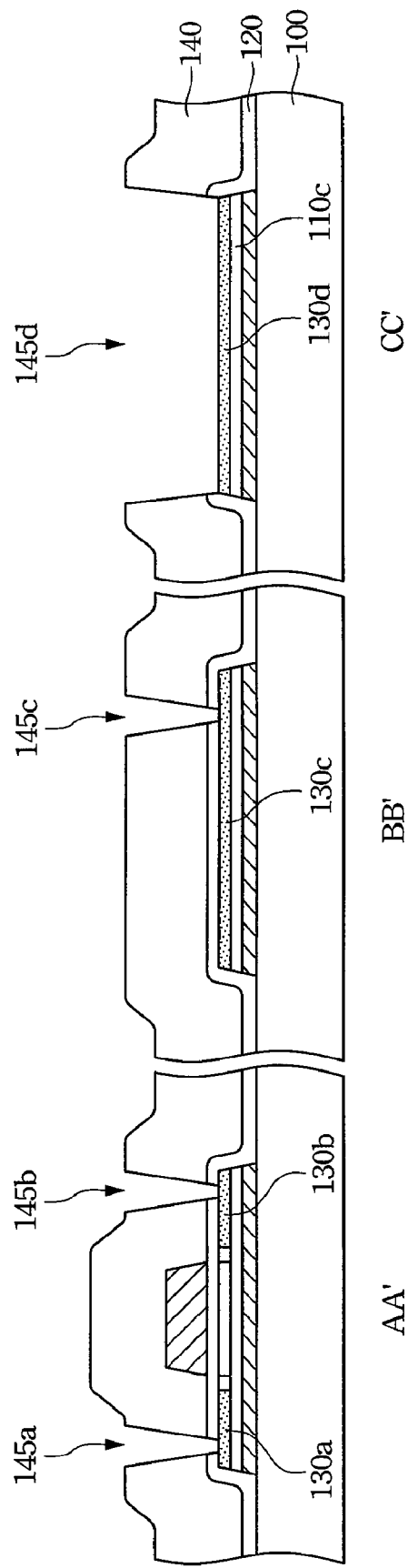

In FIG. 3, a second dielectric layer 140 is formed on the gate dielectric layer 120, the gate 125a, the scan line 125b and the second terminal 125c. Next, the second dielectric layer 140 is patterned to form a first opening 145a, a second opening 145b, a third opening 145c and a forth opening 145d to respectively expose the source 130a, the drain 130b, the second electrode 130c, and the heavily doped region 130d. The material of the second dielectric layer 140 can be silicon oxide, for example.

Figure 4A:
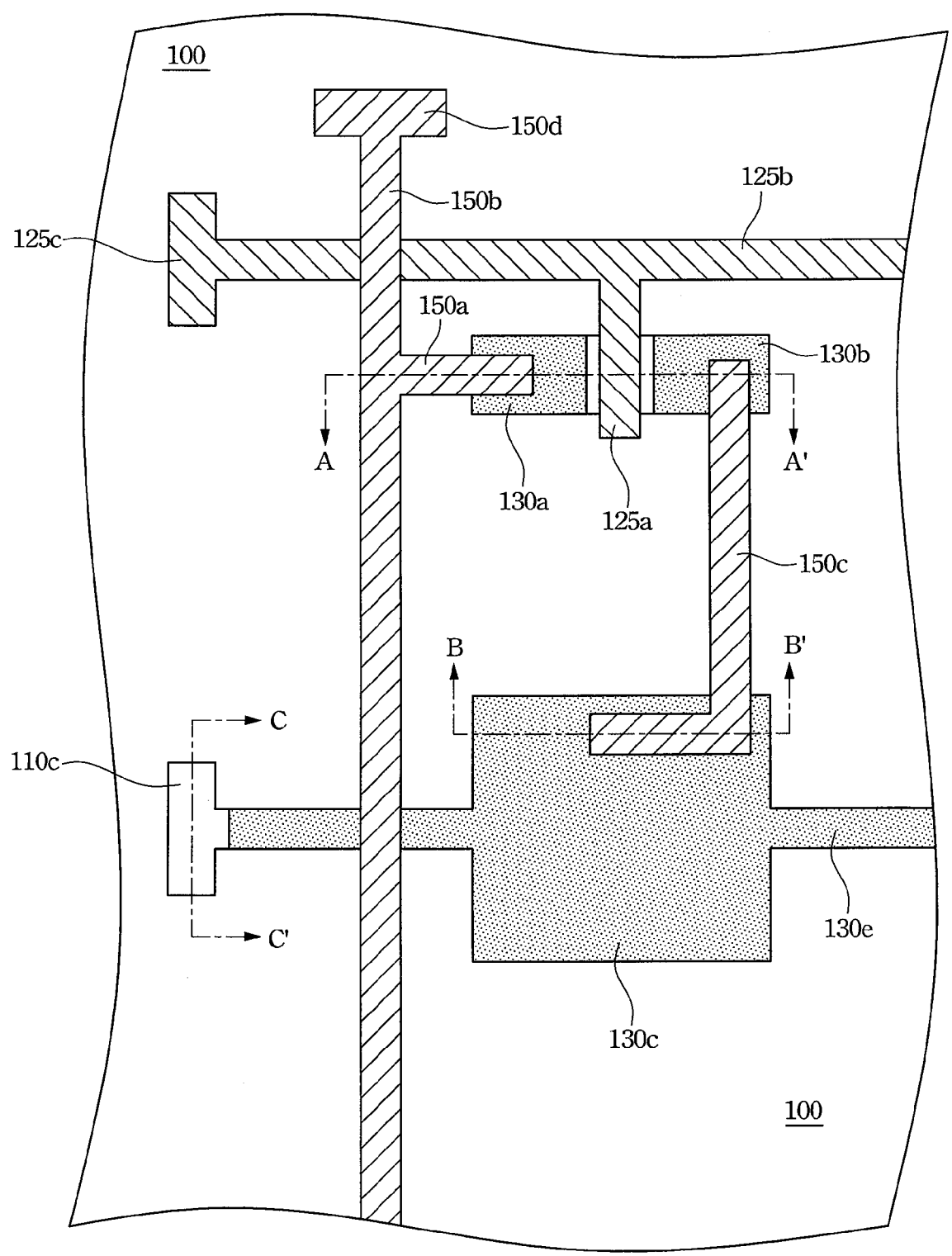
Figure 4B:
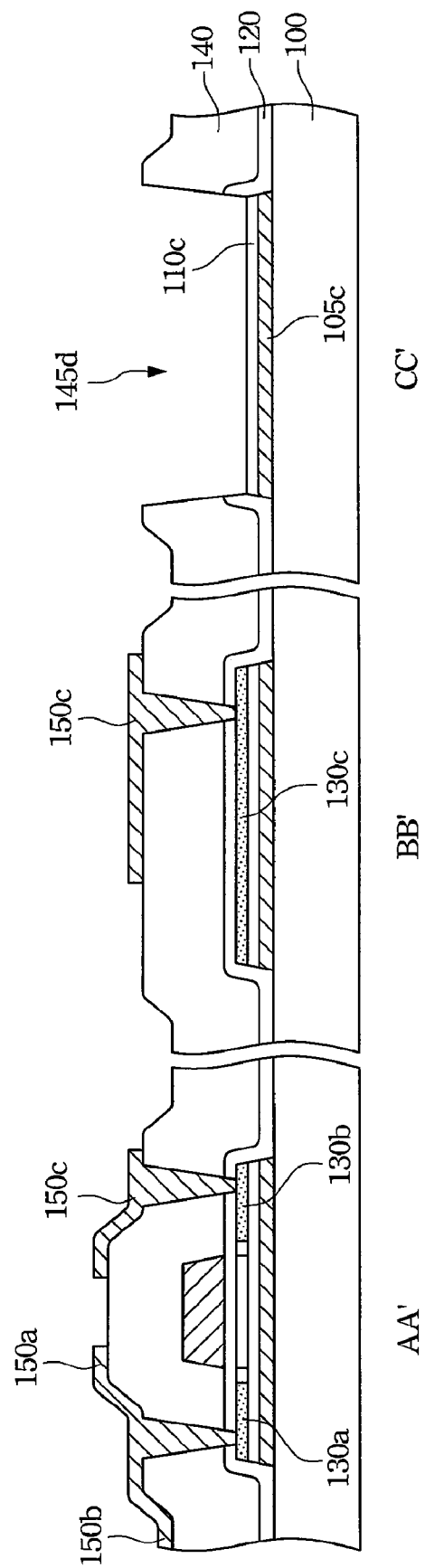

FIG. 4A is a plan view, and FIG. 4B are cross-sectional views of sections AA', BB', and CC'. In FIGS. 4A-4B, a third metal layer is formed on the second dielectric layer 140 and in the first opening, the second opening 145b, the third opening 145c and the forth opening 145d. The third metal layer is patterned to form a data line 150b, a third terminal 150d at the end of the data line 150b, a first conductive line 150a connecting the data line 150b and the source 130a via the first opening 145a, and a second conductive line 150c connecting the drain 130b (via the second opening 145b) and the second electrode 130c (via the third opening 145c). At the same time, the second metal layer in the fourth opening 145d and the exposed heavily doped region 130d are removed to expose the first dielectric layer 110c.

Figure 5:
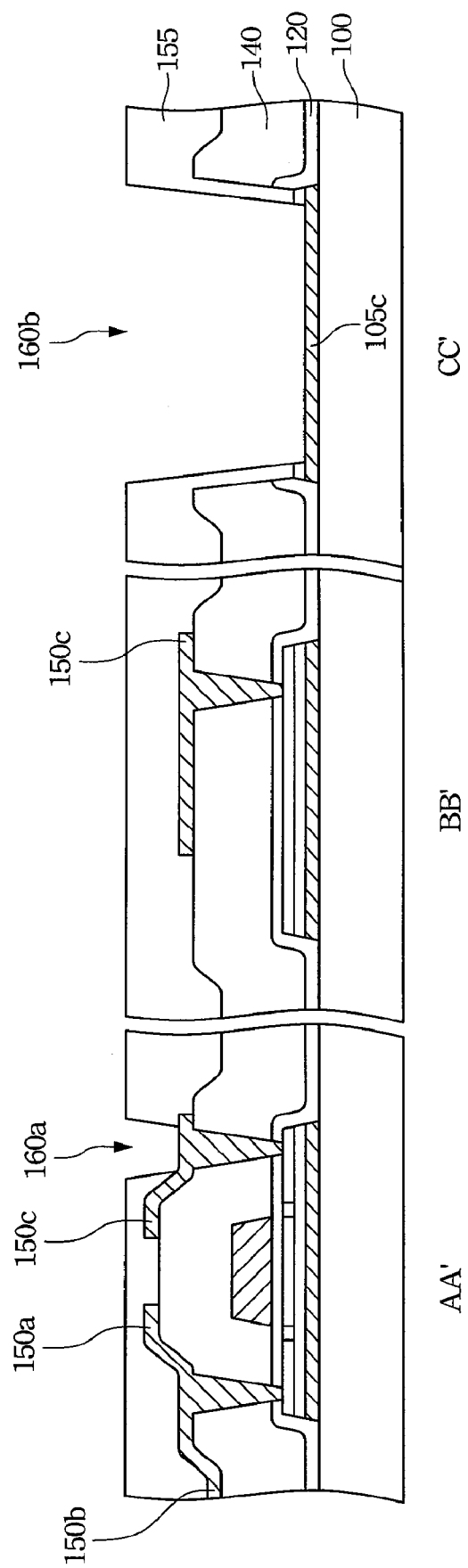

In FIG. 5, a planar layer 155 is formed on the second dielectric layer 140, the data line 150b, the first conductive line 150a, the second conductive line 150c, the third terminal 150d, and in the fourth opening 145d. The planar layer 155 is then patterned to form a fifth opening 160a to expose the second conductive line 150c and a sixth opening 160b to expose the first terminal 105c.

Figure 6A:
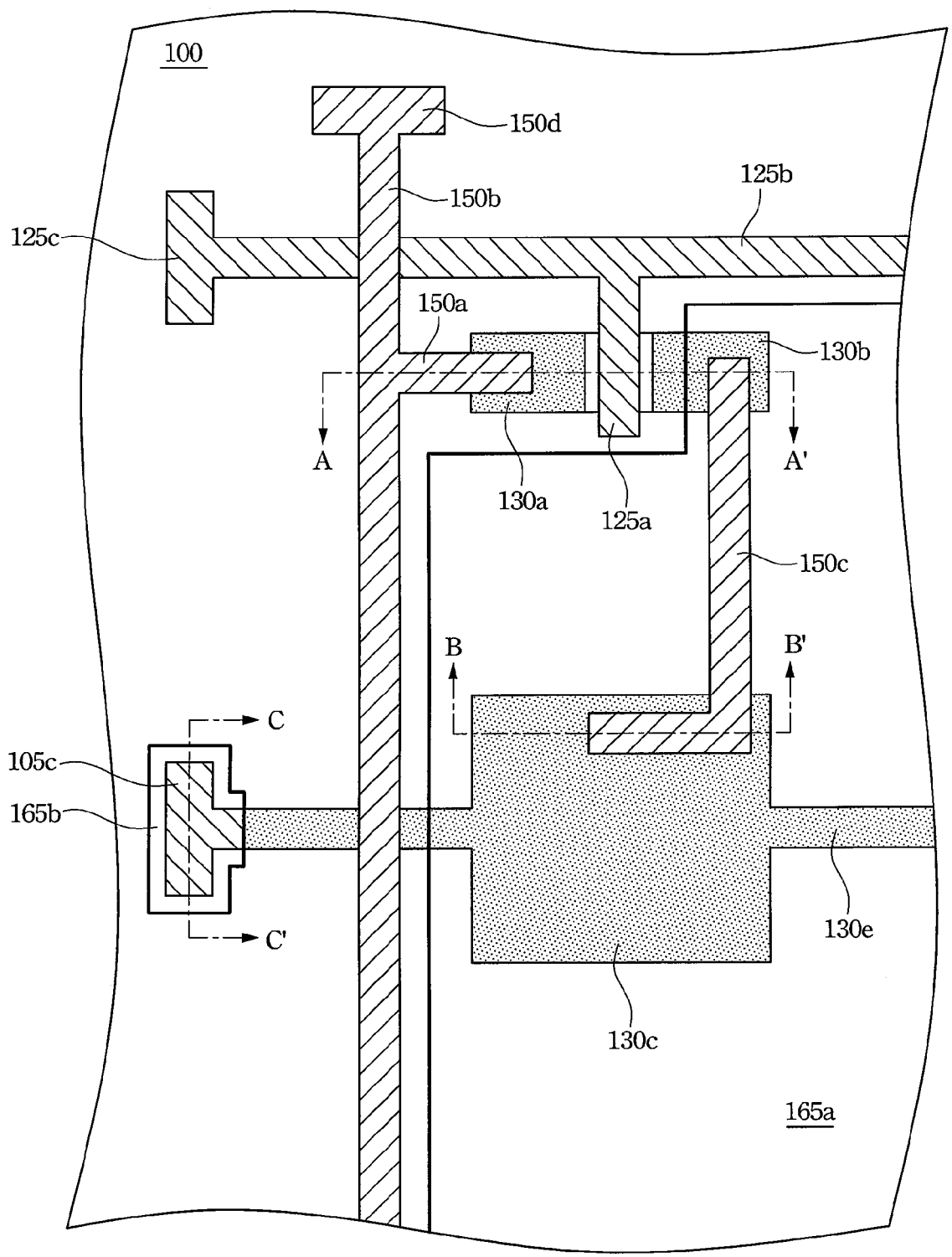
Figure 6B:
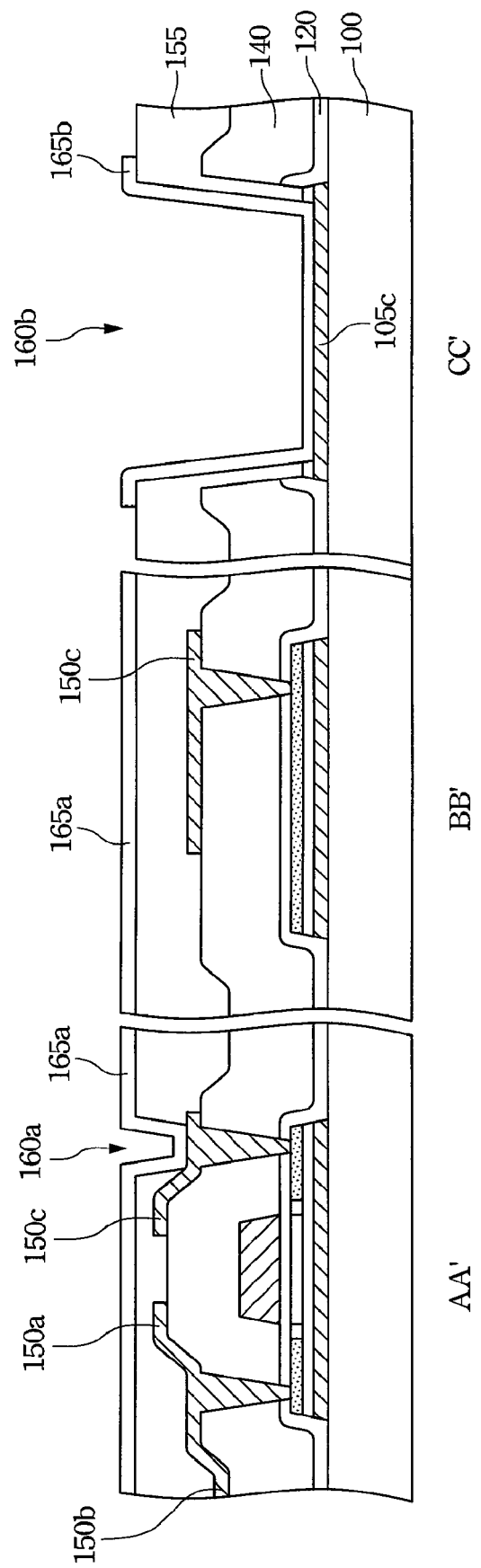

FIG. 6A is a plan view and FIG. 6B are cross-sectional views of sections AA', BB', and CC'. In FIGS. 6A-6B, a transparent conductive layer is formed on the planar layer 155, and in the fifth opening 160a and the sixth opening 160b. The transparent conductive layer is patterned to form a pixel electrode 165a and a protective layer 165b on the first terminal 105c. The material of the transparent conductive layer can be indium tin oxide, indium zinc oxide, or aluminum zinc oxide, for example.

Double Gate Embodiment

Figure 7A:
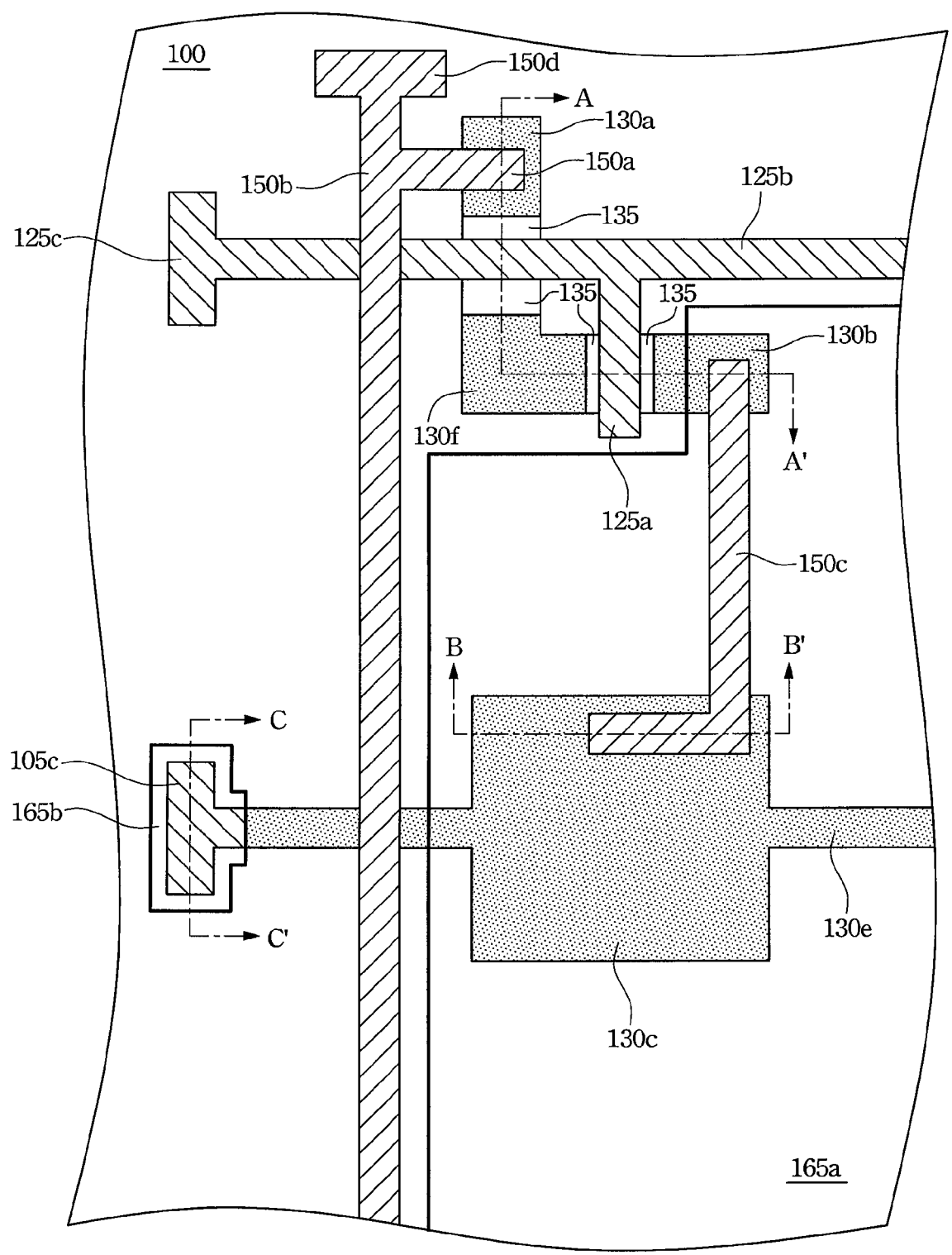
FIGS. 7A-7B are diagrams showing a process for fabricating a pixel array for use in an LCD, according to a double-gate embodiment of this invention.
Figure 7B:
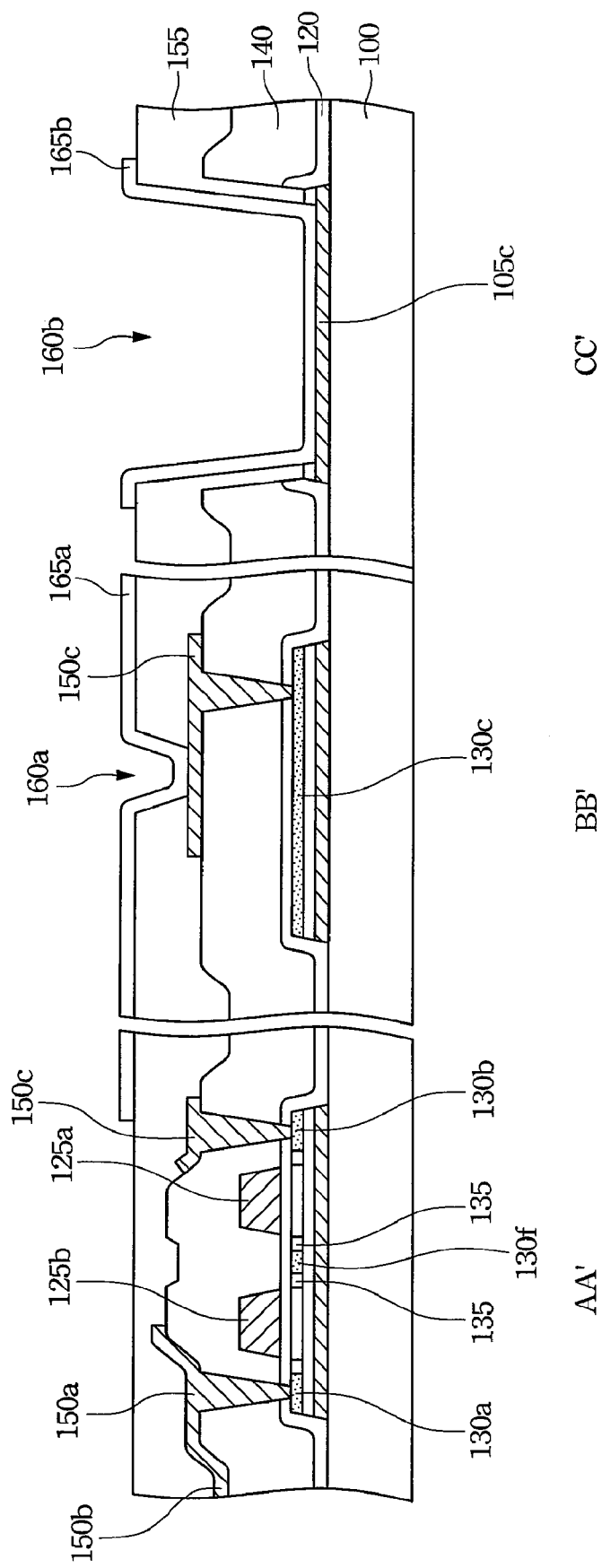

FIGS. 7A-7B are diagrams showing a process for fabricating a pixel array for use in an LCD, according to a double-gate embodiment of this invention. FIG. 7A is a plan view, and FIG. 7B are cross-sectional views of sections AA', BB', and CC'.

The pixel structure in double gate embodiment is structurally identical (e.g. elements shown in sections BB' and CC') to the pixel structure disclosed in single gate embodiment. The only difference is that transistor in the single-gate pixel structure possess single gate, while the transistor in the double-gate pixel structure possess double gates (shown in section AA'). Therefore, elements in double gate embodiment (FIGS. 7A-7B) identical to those in single gate embodiment (FIGS. 1A-6B) are numbered identically. Furthermore, since the process for fabricating the double-gate embodiment is basically the same as the process for fabricating the single-gate embodiment, the detailed descriptions of the double-gate embodiment is omitted and only the transistor's structure is discussed below.

In FIG. 7A, the active stack 118a of the transistor is bent to overlap with the gate 125a and the scan line 125b to form a double gate structure. In section AA' of FIG. 7B, gate 125a, overlapped portion of the scan line 125b, source 130a, drain 130b, and heavily doped region 130f constitute the double-gate transistor. In addition, lightly doped regions 135 can be formed on both sides of the gate 125a and the overlapped portion of the scan line 125b.

Accordingly, the bottom electrode, i.e. the first electrode 105b, of the storage capacitor is made by metal, and the upper electrode, i.e. the second electrode 130c, is made by heavily doped silicon layer. Hence, compared with a conventional capacitor composed of non-doped silicon layer, gate dielectric layer, and metal, the storage capacity is greatly increased. Moreover, a metal light-shielding layer is under the transistor to reduce the light-induced leakage current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel structure of a liquid crystal display, the pixel structure comprising:
   a thin film transistor on an active area of a substrate, the thin film transistor comprises:
   an active stack composed of a metal light-shielding layer, a dielectric layer and a silicon island, wherein the silicon island has source and drain on two ends thereof;
   a gate dielectric layer on the active stack; and
   at least a gate on the gate dielectric layer over the active stack;
   a storage capacitor, having a first electrode, a capacitive dielectric layer and a second electrode from bottom to top, on a capacitive area of the substrate, wherein the first electrode and the metal light-shielding layer are discontinuous and separated from each other and are made of a first metal layer, the capacitive dielectric layer and the dielectric layer are discontinuous and separated from each other and are made of a first dielectric layer, the second electrode and the silicon island are made of a same single silicon layer and are discontinuous and separated from each other, and the second electrode is a heavily doped silicon layer and connects the drain; and
   a pixel electrode connecting the second electrode.

2. The pixel structure of claim 1, further comprising two lightly doped regions between the source and the drain.

3. The pixel structure of claim 1, further comprising:
   a scan line electrically connecting the gate;
   a second dielectric layer over the gate dielectric layer, the gate and the scan line;
   a data line on the second dielectric layer;
   a first conductive line on the second dielectric layer and connecting the data line and the source; and
   a second conductive line on the second dielectric layer and connecting the second electrode to the pixel electrode.

4. The pixel structure of claim 3, further comprising:
a capacitive line stack electrically connecting the storage capacitor, wherein the structure of the capacitive line stack is the same as the structure of the storage capacitor;
a first terminal at an end of the capacitive line stack, wherein the first terminal is made of the first metal layer; and
a protective layer on the first terminal, wherein the protective layer and the pixel electrode are made of a same transparent conductive layer.

5. The pixel structure of claim 4, further comprising a second terminal on an end of the scan line and a third terminal on an end of the data line.

6. The pixel structure of claim 5, wherein the scan line, the gate, and the second terminal are made of a second metal layer, and the data line, the first conductive line, the second conductive line and the third terminal are made of a third metal layer.

7. The pixel structure of claim 3, wherein a portion of the scan line locates on the active stack.

8. The pixel structure of claim 1, wherein the silicon layer is made from polysilicon or amorphous silicon.

9. The pixel structure of claim 3, wherein the first and the second dielectric layer are made from a material comprises silicon oxide.

10. The pixel structure of claim 4, wherein the transparent conductive layer is made from indium tin oxide, indium zinc oxide, or aluminum zinc oxide.

11. A pixel structure of a liquid crystal display, the pixel structure comprising:
a thin film transistor on an active area of a substrate, the thin film transistor comprises:
an active stack composed of a metal light-shielding layer, a dielectric layer and a silicon island, wherein the metal light-shielding layer, the dielectric layer and the silicon island have the same pattern, and the silicon island has source and drain on two ends thereof;
a gate dielectric layer on the active stack; and
at least a gate on the gate dielectric layer over the active stack;
a storage capacitor, having a first electrode, a capacitive dielectric layer and a second electrode from bottom to top, on a capacitive area of the substrate, wherein the first electrode and the metal light-shielding layer are discontinuous and separated from each other and are made of a first metal layer, the capacitive dielectric layer and the dielectric layer are discontinuous and separated from each other and are made of a first dielectric layer, the second electrode and the silicon island are made of a same single silicon layer and are discontinuous and separated from each other, and the second electrode is a heavily doped silicon layer and connects the drain;
a scan line electrically connecting the gate;
a second dielectric layer over the gate dielectric layer, the gate and the scan line;
a data line on the second dielectric layer;
a first conductive line on the second dielectric layer and connecting the data line and the source; and
a second conductive line on the second dielectric layer and connecting the second electrode to the drain; and
a pixel electrode connecting the second conductive line.

12. The pixel structure of claim 11, further comprising two lightly doped regions between the source and the drain.

13. The pixel structure of claim 11, further comprising:
a capacitive line stack electrically connecting the storage capacitor, wherein the structure of the capacitive line stack is the same as the structure of the storage capacitor;
a first terminal at an end of the capacitive line stack, wherein the first terminal is made of the first metal layer; and
a protective layer on the first terminal, the protective layer and the pixel electrode being made of a same transparent conductive layer.

14. The pixel structure of claim 13, further comprising a second terminal on an end of the scan line and a third terminal on an end of the data line.

15. The pixel structure of claim 14, wherein the scan line, the gate, and the second terminal are made of a second metal layer, and the data line, the first conductive line, the second conductive line and the third terminal are made of a third metal layer.

16. The pixel structure of claim 11, wherein a portion of the scan line locates on the active stack.

17. The pixel structure of claim 11, wherein the silicon layer is made from polysilicon or amorphous silicon.

18. The pixel structure of claim 11, wherein the first and the second dielectric layer are made from a material comprises silicon oxide.

19. The pixel structure of claim 13, wherein the transparent conductive layer is made from indium tin oxide, indium zinc oxide, or aluminum zinc oxide.

* * * * *